United States Patent
Chien et al.

(10) Patent No.: US 11,977,423 B2
(45) Date of Patent: May 7, 2024

(54) SYSTEM AND METHOD FOR THERMAL MANAGEMENT OF MOTION SENSITIVE SYSTEMS

(71) Applicant: Dell Products L.P., Round Rock, TX (US)

(72) Inventors: Hung-Pin Chien, Taipei (TW); Jyh-Yinn Lin, Taipei (TW); Yu-Wei Chi Liao, Taipei (TW); Chien Yen Hsu, Taipei (TW); Ming-Hui Pan, Taipei (TW)

(73) Assignee: Dell Products L.P., Round Rock, TX (US)

( * ) Notice: Subject to any disclaimer, the term of this patent is extended or adjusted under 35 U.S.C. 154(b) by 366 days.

(21) Appl. No.: 17/556,536

(22) Filed: Dec. 20, 2021

(65) Prior Publication Data

US 2023/0195188 A1    Jun. 22, 2023

(51) Int. Cl.
*G06F 1/20* (2006.01)
*H05K 7/20* (2006.01)

(52) U.S. Cl.
CPC ......... *G06F 1/206* (2013.01); *H05K 7/20209* (2013.01)

(58) Field of Classification Search
None
See application file for complete search history.

(56) References Cited

U.S. PATENT DOCUMENTS

| 11,460,898 B2 * | 10/2022 | Ping | G11B 33/142 |
| 2017/0060697 A1 * | 3/2017 | Berke | G06F 3/0619 |
| 2019/0339753 A1 * | 11/2019 | Shabbir | H05K 7/20136 |

* cited by examiner

*Primary Examiner* — Farley Abad
*Assistant Examiner* — Dayton Lewis-Taylor
(74) *Attorney, Agent, or Firm* — Womble Bond Dickinson (US) LLP

(57) ABSTRACT

Methods and systems for thermal management of hardware resources that may be used to provide computer implemented services are disclosed. The disclosed thermal management method and systems may improve the likelihood of data processing systems providing desired computer implemented services by improving the thermal management of the hardware resources without impairment of storage devices. To improve the likelihood of the computer implemented services being provided, the systems may proactively identify whether storage devices subject to impairment due to dynamic motion are present. If such storage devices are present, then the system may automatically take action to reduce the likelihood of the storage devices being subject to dynamic motion sufficient to impair their operation.

20 Claims, 8 Drawing Sheets

SYSTEM AND METHOD FOR THERMAL MANAGEMENT OF MOTION SENSITIVE SYSTEMS

FIELD OF THE DISCLOSURE

Embodiments disclosed herein generally relate to thermal management. More particularly, embodiments disclosed herein relate to thermal management in systems that are sensitive to dynamic motion.

BACKGROUND

Computing devices may store data and used stored data when performing computations. For example, computing devices may utilize data when providing computer implemented services. To provide the computer implemented services, the computing devices may consume electrical power to perform the computations. The consumed electrical power may generate heat.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
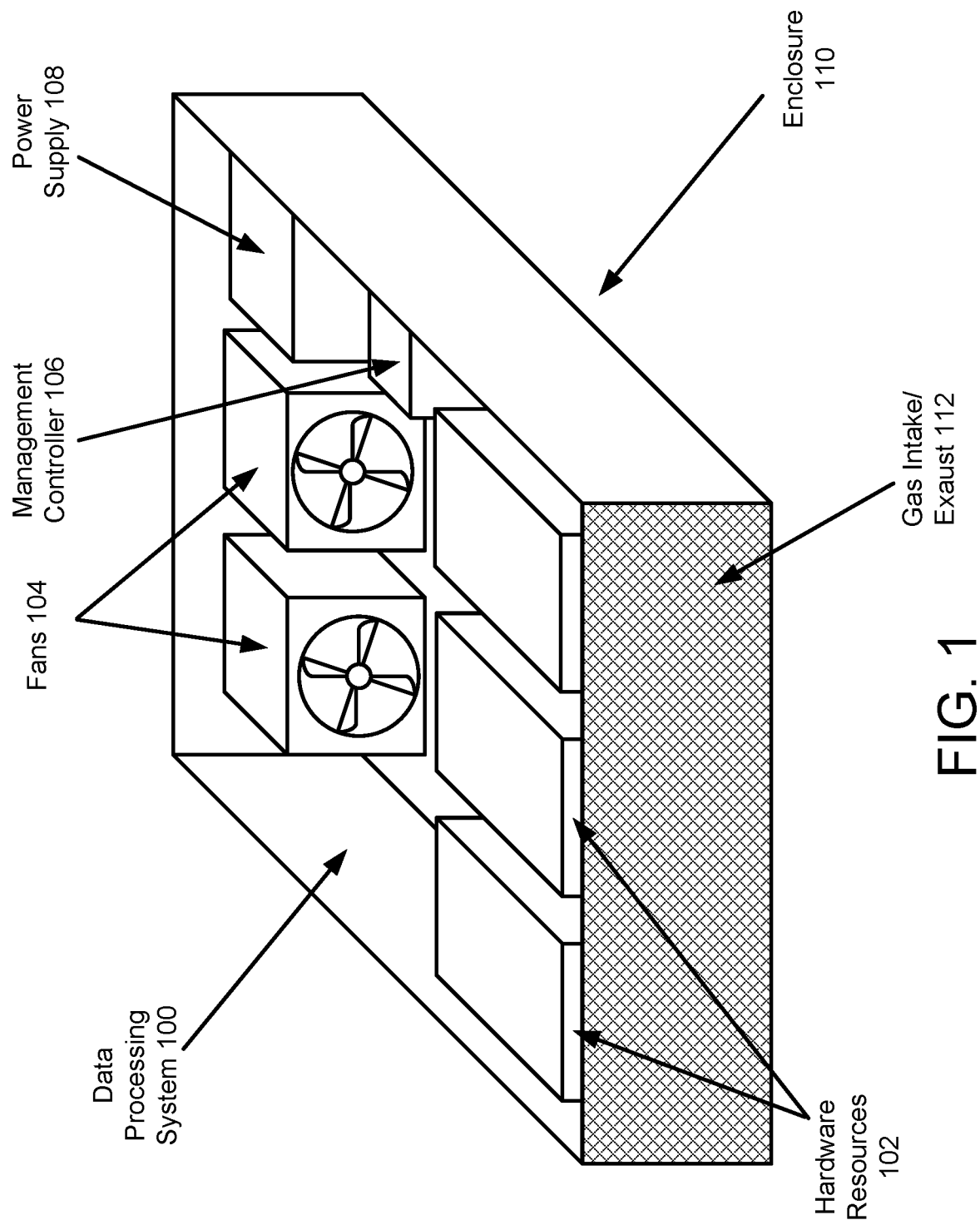
FIG. 1 shows a diagram illustrating a system in accordance with an embodiment.

Various embodiments and aspects of the disclosure will be described with reference to details discussed below, and the accompanying drawings will illustrate the various embodiments. The following description and drawings are illustrative of the embodiments and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments of the invention relate to methods and systems for thermal management of hardware resources that may be used to provide computer implemented services. Specifically, the disclosed thermal management method and systems may improve the likelihood of data processing systems providing desired computer implemented services by improving the thermal management of the hardware resources without impairment of storage devices.

To improve the likelihood of the computer implemented services being provided, the systems may proactively identify whether storage devices subject to impairment due to dynamic motion are present. If such storage devices are present, then the system may automatically take action to reduce the likelihood of the storage devices being subject to dynamic motion sufficient to impair their operation.

To do so, the system may place limits on the operating point of fans or other types of devices that may place dynamic loads on the storage devices by virtue of the operation of the fans. By placing the operating point limits on the fans, the dynamic mechanical loads placed on the storage devices by the fans may be reduced to a level unlikely to impair operation of the storage devices.

In addition to enforcing operating point limits on fans, the system may also automatically enforce corresponding power consumption limits on various hardware devices such as processors. The power consumption limits may reflect the decreased ability to cool the various hardware devices due to enforcement of the operating point limits on the fans, which may reduce cooling rates available to the hardware devices.

To manage operation over time, the aforementioned operating point and power consumption limits for a variety of types of storage devices may be ascertained and used to populate a lookup data structure. As the hardware devices of the systems change over time, corresponding different operating point and power consumption limits may be identified using the lookup data structure. In this manner, the operation of the systems may be dynamically adapted to changes in the hardware components of the systems without overly limiting the systems (e.g., by using one-size fits all operating point limits).

In an embodiment, a data processing system to provide computer implemented services is provided. The data processing system may include hardware resources used to provide the computer implemented services; a fan adapted to generate a gas flow proximate to the hardware resources for thermal management; and a management controller adapted to: obtain an inventory of the hardware resources at startup of the data processing system; identify, based on the inventory, one or more operating point limits based on susceptibility of a storage device of the hardware resources to impairment due to a dynamic mechanical load due to operation of the fan; and enforce the one or more operating point limits on the data processing system while the computer implemented services are being provided to prevent the impairment of the storage device.

Enforcing the one or more operating point limits on the data processing system may include preventing the fan from exceeding a rate of rotation based on the one or more operating point limits, the rate of rotation being less than a maximum rate of rotation of the fan.

Enforcing the one or more operating point limits on the data processing system may also include preventing a processor of the hardware resources from exceeding a rate of power consumption based on the one or more operating point limits, the rate of power consumption being based on the rate of rotation; and rate of power consumption being less than a second power consumption rate associated with a maximum performance level of the processor.

A maximum data access rate of the storage device may be reduced by a rotation rate of the fan exceeding the rate of rotation.

The management controller may also identify, based on a second inventory of the hardware resources, that the storage device has been replaced with a second storage device; identify, based on the second inventory, one or more second operating point limits based on susceptibility of the second storage device to impairment due to the dynamic mechanical load due to the operation of the fan; and enforce the one or more second operating point limits on the data processing system while the computer implemented services are being provided to prevent the impairment of the second storage device, the one or more operating point limits not being enforced while the one or more second operating point limits are enforced.

The susceptibility of the storage device of the hardware resources to impairment due to the dynamic mechanical load due to operation of the fan may be determined by identifying one or more performance metrics associated with the storage device; performing one or more dynamic motion tests using the fan and the one or more performance metrics to identify at least one threshold; and using the threshold to define the susceptibility of the storage device to the impairment.

The one or more dynamic motion tests may be performed by: setting operation of the fan to test operating points; while in each of the test operating points, recording data access performance of the storage device; and comparing the data access performance to the one or more performance metrics to identify the threshold.

Identifying the one or more operating point limits may include obtaining an identifier of the fan; and performing a lookup using the fan identify with a data structure stored in the management controller, the lookup providing the one or more operating point limits.

The management controller may include a computing device hosted by the data processing system, the computing device operating independently from the data processing system.

The impairment of the storage device may include a reduction in a rate of data access by the storage device below a nominal rate of data access by the storage device.

Identifying one or more operating point limits may include classifying the storage device into a category; performing a lookup using the category with a data structure stored in the management controller, the lookup providing the one or more operating.

The category may be one of a plurality of categories that are updated over time as new storage devices become available for deployment to the data processing system.

In an embodiment, a method of thermally managing a data processing system providing computer implemented services is provided. The method may include obtaining, by a management controller hosted by the data processing system, an inventory of hardware resources of the data processing system at startup of the data processing system; identifying, by the management controller and based on the inventory, one or more operating point limits based on susceptibility of a storage device of the hardware resources to impairment due to a dynamic mechanical load due to operation of a fan used to thermally manage the hardware resources; and enforcing the one or more operating point limits on the data processing system while the computer implemented services are being provided to prevent the impairment of the storage device.

Enforcing the one or more operating point limits on the data processing system may include preventing the fan from exceeding a rate of rotation based on the one or more operating point limits, the rate of rotation being less than a maximum rate of rotation of the fan.

Enforcing the one or more operating point limits on the data processing system may also include preventing a processor of the hardware resources from exceeding a rate of power consumption based on the one or more operating point limits, the rate of power consumption being based on the rate of rotation; and rate of power consumption being less than a second power consumption rate associated with a maximum performance level of the processor.

A maximum data access rate of the storage device may be reduced by a rotation rate of the fan exceeding the rate of rotation.

In an embodiment, a non-transitory computer readable medium storing instructions that, when executed by a processor, cause a method for thermally managing a data processing system providing computer implemented services is provided. The method may be similar to that discussed above and/or that performed by the management controller.

Turning to FIG. 1, a diagram illustrating a system in accordance with an embodiment is shown. The system shown in FIG. 1 may be used to provide computer implemented services. The system may include data processing system 100 and enclosure 110. Each of these components is discussed below.

Data processing system 100 may provide the computer implemented services. When doing so, data processing system 100 may consume electrical power from other sources (e.g., via power supply 108 or another device external to the data processing system, either of which may obtain power from a utility or other source). To provide the computer implemented services, data processing system 100 may include hardware resources 102 and power supply 108.

Hardware resources 102 may include any number of physical devices (e.g., processors, memory modules, storage devices, communications devices, etc.) that provide computing resources (e.g., processor cycles, transitory storage, persistent storage, communications bandwidth, etc.) usable to provide the computer implemented services. The computing resources may be used to support applications (e.g., computing instructions executing with the computing resources) hosted by data processing system 100. The applications may provide the computer implemented services. The computer implemented services may include any type and quantity of computer implemented services such as, for example, database services, data storage services, electronic communications services, etc. Data processing system 100 may provide other types of computer implemented services without departing from embodiments disclosed herein.

When operating, hardware resources 102 may consume electrical power to provide the computing resources used to provide the computer implemented services. The hardware resources may utilize power from power supply 108, and/or other sources. Power supply 108 may include any number of physical devices (e.g., transformers, current/voltage sensors, controllers, etc.) usable to obtain power from other power sources (not shown) and provide conditioned power to hardware resources 102 and/or other components. The power obtained from the other power sources may be any form of power (e.g., alternating current, direct current) but the conditioned power may have specific characteristics (e.g., direct current of a predetermined voltage level) based on the hardware resources 102. For example, hardware resources 102 may not operate as expected when hardware resources 102 are provided with power that is not conditioned power.

Hardware resources 102 may generate heat when providing their functionality. For example, hardware resources 102 may consume power when providing computing resources and generate heat as a byproduct. Generally, hardware resources 102 and/or other components of data processing system 100 may have associated thermal ranges in which the hardware resources 102 are capable of operating (e.g., at high reliability). If the temperatures of various portions of hardware resources 102 fall outside of the thermal ranges, then the corresponding portions of hardware resources 102 may fail to operate (e.g., as intended/expected), may operate with some impairment (e.g., reduced rate, increased error rates in operation, etc.), or may otherwise operate in a manner that may impair (partially or entirely) the ability of data processing system 100 of providing the computer implemented services.

In addition to thermal limits, some components of hardware resources 102 may also have dynamic motion limits. For example, hardware resources 102 may include one or more storage devices. The storage devices may store data for future use. However, the rate at which data may be stored in and/or retrieved from the storage devices may depend on the quantity of dynamic motion of the storage devices.

For example, when the dynamic motion of a storage device is below a threshold level, then the storage device may operate nominally and provide nominal data access rates. However, when the dynamic motion of the storage device exceeds the threshold level, then the storage device may not operate nominally. For example, the dynamic motion may cause read/write failures, increase seek time, or otherwise reduce the ability and/or life cycle of the storage device to provide its data storage services. Different types of storage devices may have different threshold levels of dynamic motion and may suffer different amounts of impairment in storage services when the threshold levels of dynamic motion are exceeded.

Data processing system 100 may include one or more fans 104 and management controller 106 to thermally manage hardware resources 102. Fans 104 may thermally manage hardware resources 102 by selectively generating flows of gas proximate to hardware resources 102 which may allow heat from hardware resources 102 to be removed. Removing heat from hardware resources 102 may cool them. The rate at which heat is removed from hardware resources 102 may depend on the rate of the flow of gas proximate to hardware resources 102.

In an embodiment, fans 104 include functionality to modulate the rate of gas flows generated by their operation. For example, a fan may include a motor (e.g., electric) and one or more blades. The rate at which the blades move gasses thereby generating a gas flow may be dependent on the rotation rate of the motor. The rate of rotation of the motor may depend on the quantities of voltage and current with which fans 104 are driven. In an embodiment, the fans 104 are driven with a pulse width modulated voltage. The duty cycle (e.g., ratio of on to off time during each cycle of the pulse width modulated voltage) of the pulse width modulated voltage may control the rate at which fans 104 rotate (e.g., within certain limitations, fans 104 may rotate at a predetermined maximum rate with a 100% duty cycle and at reduced rates depending on the duty cycle).

However, operation of fans 104 may place mechanical loads on hardware resources 102 that cause the dynamic motion levels of hardware resources 102 to be changed (e.g., increased). The extent of the change in dynamic motion levels of hardware resources 102 due to the mechanical load cause by fans 104 may be related to the rate (e.g., an operating point) at which fans 104 spin or otherwise operate. Consequently, operation of fans 104 at higher operating points may limit the ability of storage devices of hardware resources 102 to provide storage services.

For example, as the operating point of fans 104 is increased, the magnitude of the mechanical load placed on a storage device of hardware resources 102 may cause the dynamic motion of the storage device to exceed the corresponding threshold level, above which the storage services provided by the storage device are impaired. Thus, to reduce impairment of the storage services, the operating point of fans 104 may be reduced.

However, as noted above, the operation points of fans 104 may need to be increased in some scenarios to provide for thermal management of some of hardware resources 102. For example, a processor of hardware resources 102 may require certain levels of gas flow proximate to it to stay within its thermal operating range. If fans 104 are unable to meet the gas flow rate requirement (e.g., due to operating point restrictions due to storage device impairment concerns), then the processor may not be able to operate nominally (e.g., at full capacity) without exceeding its thermal operating range. Consequently, the processor may be throttled to ensure that it does not exceed the thermal operating range at the cost of reducing the performance of the processor.

Further, the extent of the mechanical load placed on storage devices by fans 104 may depend on the specific topology and/or arrangement of the storage devices of hardware resources 102 with respect to fans 104. For example, while fans 104 and hardware resources 102 are illustrated with respect to specific example locations in FIG. 1, these components may be positioned in different arrangements in enclosure 110. The placement, orientation, and/or other characteristics of these components may cause fans 104 to impart different levels of mechanical load on hardware resources 102 (e.g., even for a same operating point of fans 104).

In general, embodiments disclosed herein relate to system, methods, and devices for improving the quality of computer implemented services provided by a data processing system. To do so, the data processing system may include management controller 106 that manages the operating points of fans 104. Management controller 106 may manage the operating points of fans 104 in a manner that reducing the likelihood of storage device operation being impaired due to operation of fans 104.

Additionally, management controller 106 may also manage the operating point or power budget associated with one or more hardware resources 102. For example, management controller 106 may set the operating point of or limit power consumption rates by hardware resources 102 based on limits placed on the operation of fans 104. Management controller 106 may do so to reduce the likelihood of one or more hardware resources 102 exceeding corresponding thermal operating ranges. Consequently, error in the operation of the one or more hardware resources 102 (or other types of undesirable operation) may be avoided by retaining the temperatures of the one or more hardware resources 102 within the corresponding thermal operating ranges.

In an embodiment, management controller 106 dynamically manages the manner in which it manages operation of fans 104 and/or hardware resources 102. For example, at startup, management controller 106 may reconsider how best to manage the operation of these components. By doing so, management controller 106 may dynamically update its management of these components to respond to changes in these components (e.g., reconfiguration of the components, replacement of the components, disablement of the components, changes in expected/desired performance levels for the components, etc.)

When providing its functionality, management controller 106 may manage the thermal environment of data processing system 100. To do so, management controller 106 may (i) collect information regarding temperatures of hardware resources 102 (and/or temperatures of other components), (ii) collect information regarding the operating points of fans 104, and (iii) use the collected information, at least in part, to set the operating points of fans 104 and/or hardware resources 102. When doing so, management controller 106 may directly (e.g., via signaling) or indirectly (e.g., by instructing another management entity that manages these components) manage these components. For example, while not shown, data processing system 100 may include a fan management controller (e.g., a chassis controller) and/or a hardware resources controller (e.g., functionality of a processor, another device) that manages the operating points of these components.

Enclosure 110 may include a physical structure for housing data processing system 100. The physical structure may be a form factor compliant structure such as, for example, a rack mount enclosure for a server. The physical structure may be other types of structures for housing data processing systems without departing from embodiments disclosed herein.

Enclosure 110 may include any number of sub-enclosures such as, for example, server chassis sleds, internal blocks, and/or other structures in which various portions of hardware resources 102 are positioned. Fans 104 may be positioned in enclosure 110 to generate predetermined flows of gasses when fans 104 operate such that the gasses, at least in part, flow by hardware resources 102. Enclosure 110 may include one or more of gas intake/exhaust 112 which may allow gasses to traverse through it. For example, a gas intake or exhaust may be implemented with a hole through enclosure 110. The hole may be entirely or partially covered with a grill, mesh, or other structure which may allow gasses to flow through the intake/exhaust while preventing objects of significant size from moving through the intake/exhaust. Fans 104 may be positioned with respect to the intake and/or exhaust on enclosure 110 (and/or in other locations) to facilitate gas flow through (e.g., in an intake and/or out of an exhaust) enclosure 110 along one or more paths. In this manner, cool gases may be brought into enclosure 110 and heated gases may be exhausted from enclosure 110.

While the system of FIG. 1 has been illustrated as including a limited number of specific components, a system may include different numbers, types, and/or quantities of components without departing from the embodiments disclosed herein.

Figure 2A:
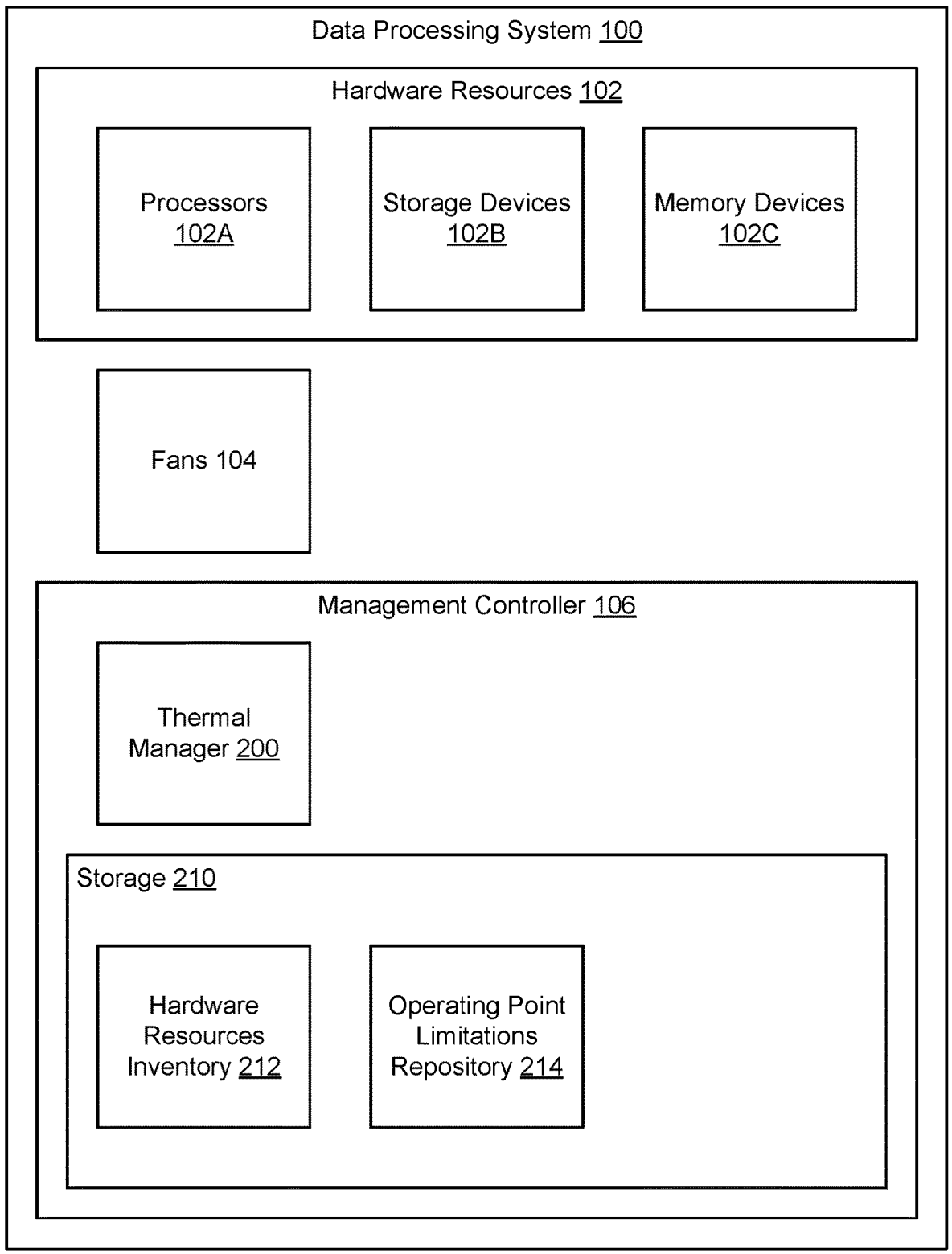
FIG. 2A shows a block diagram illustrating a data processing system in accordance with an embodiment.

Turning to FIG. 2A, a block diagram of data processing system 100 in accordance with an embodiment is shown. As discussed above, embodiments disclosed herein may improve the likelihood of a data processing system providing computer implemented services by improving the thermal management of the components of the data processing system that provide the computer implemented services without negatively impacting operation of storage devices.

To provide the computer implemented services, hardware resources 102 may include various types of physical devices that provide various types of computing resources. For example, hardware resources 102 may include one or more processors 102A which may provide data processing resources, storage devices 102B which may provide data storage resources, and memory devices 102C which may provide data memory resources. Hardware resources 102 may include other hardware devices than those illustrated in FIG. 2A and the other hardware devices may provide similar and/or different types of computing resources (e.g., usable to provide computer implemented services).

To thermally manage these hardware devices, fans 104 may be positioned to facilitate generation of gas flows usable to remove heat from the hardware devices. Fans 104 may include any number and type of fans (and/or other types of gas flow control components).

The operating points of fans 104 may be managed by management controller 106. For example, management controller 106 may cause (directly or indirectly) power to be provided to fans 104 in a manner that causes the fans to operate consistently with the operating points defined by management controller 106. Management controller 106 may define different or similar operating points for any of fans 104.

Fans 104 may be similar (e.g., mechanically) or different from each other. For example, different sized fans with different operating ranges may be included in data processing system 100 for thermal management purposes. Further, any of fans 104 may be positioned in similar or different locations. Thus, different fans may have place different levels of mechanical load on hardware resources 102 (or portions thereof) even while operating at the same operating point (e.g., which may be defined as a percentage of the maximum operating point of a respective fan).

Figure 5:
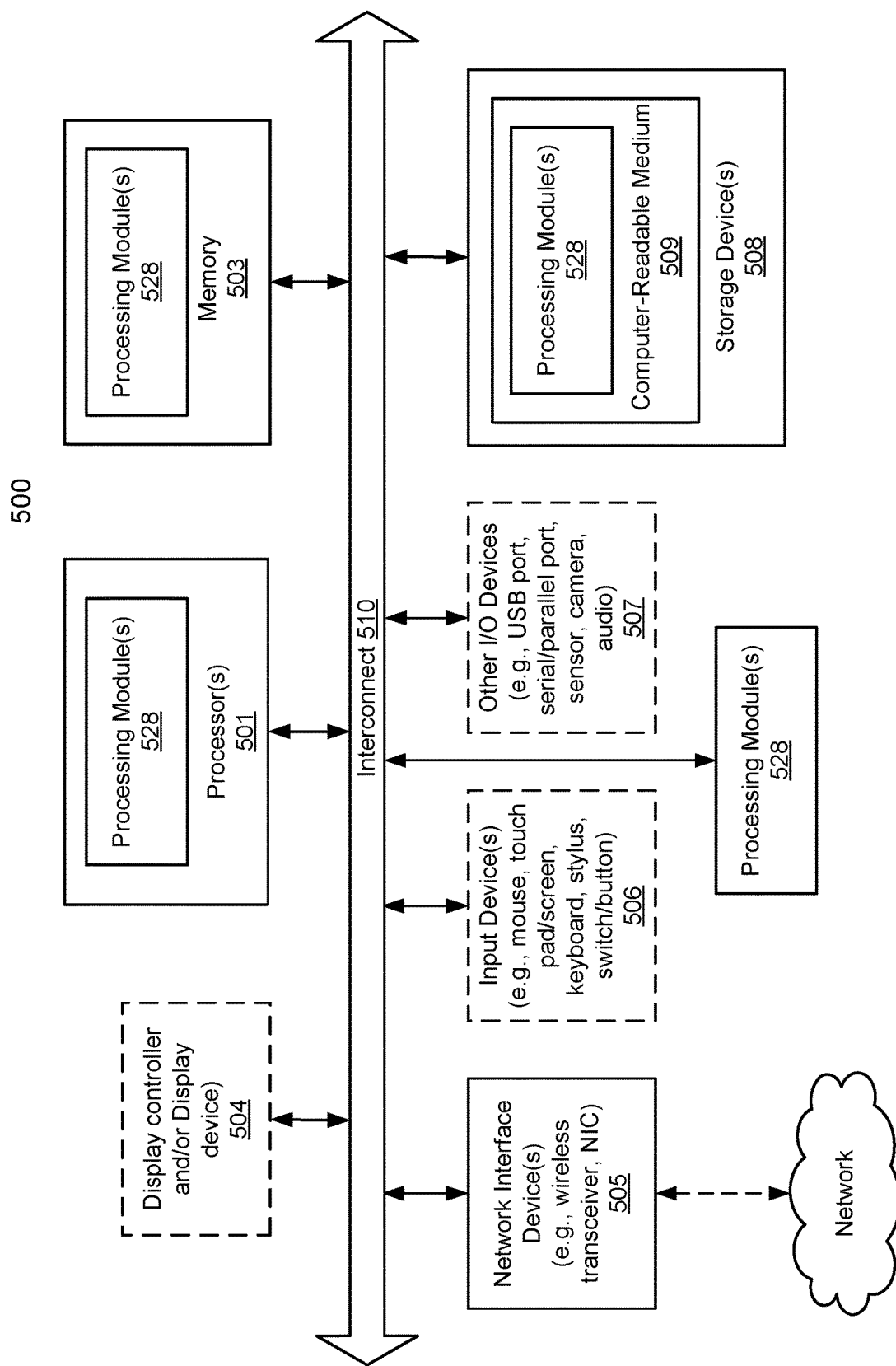
FIG. 5 shows a block diagram illustrating a data processing system in accordance with an embodiment.

Management controller 106 may manage the operation of hardware resources 102 and fans 104. Management controller 106 may be implemented using, for example, an out of band manager or other type of independently operating computing device hosted by data processing system 100. Refer to FIG. 5 for details regarding a computing device.

To provide its functionality, management controller 106 may include thermal manager 200 and storage 210.

Thermal manager 200 may manage the operating points of fans 104 and some of hardware resources 102 to meet thermal and mechanical limitations. To do so, thermal manager 200 may (i) obtain a hardware resources inventory 212 for hardware resources 102 and (ii) identify operating points (e.g., using operating point limitations repository 214). For example, hardware resources inventory 212 may be used as a key to identify any number of operating point limitations. Once obtained, the operating point limitations may be enforced on hardware resources 102 and/or fans 104.

In an embodiment, thermal manager 200 is implemented using a hardware device including circuitry. The hardware device may be, for example, a digital signal processor, a field programmable gate array, or an application specific integrated circuit. The circuitry may be adapted to cause the hardware device to perform the functionality of thermal manager 200. Thermal manager 200 may be implemented using other types of hardware devices without departing embodiment disclosed herein.

In one embodiment, thermal manager 200 is implemented using a processor adapted to execute computing code stored on a persistent storage that when executed by the processor performs the functionality of thermal manager 200 discussed throughout this application. The processor may be a hardware processor including circuitry such as, for example, a central processing unit, a processing core, or a microcontroller. The processor may be other types of hardware devices for processing information without departing embodiment disclosed herein.

Figure 3A:
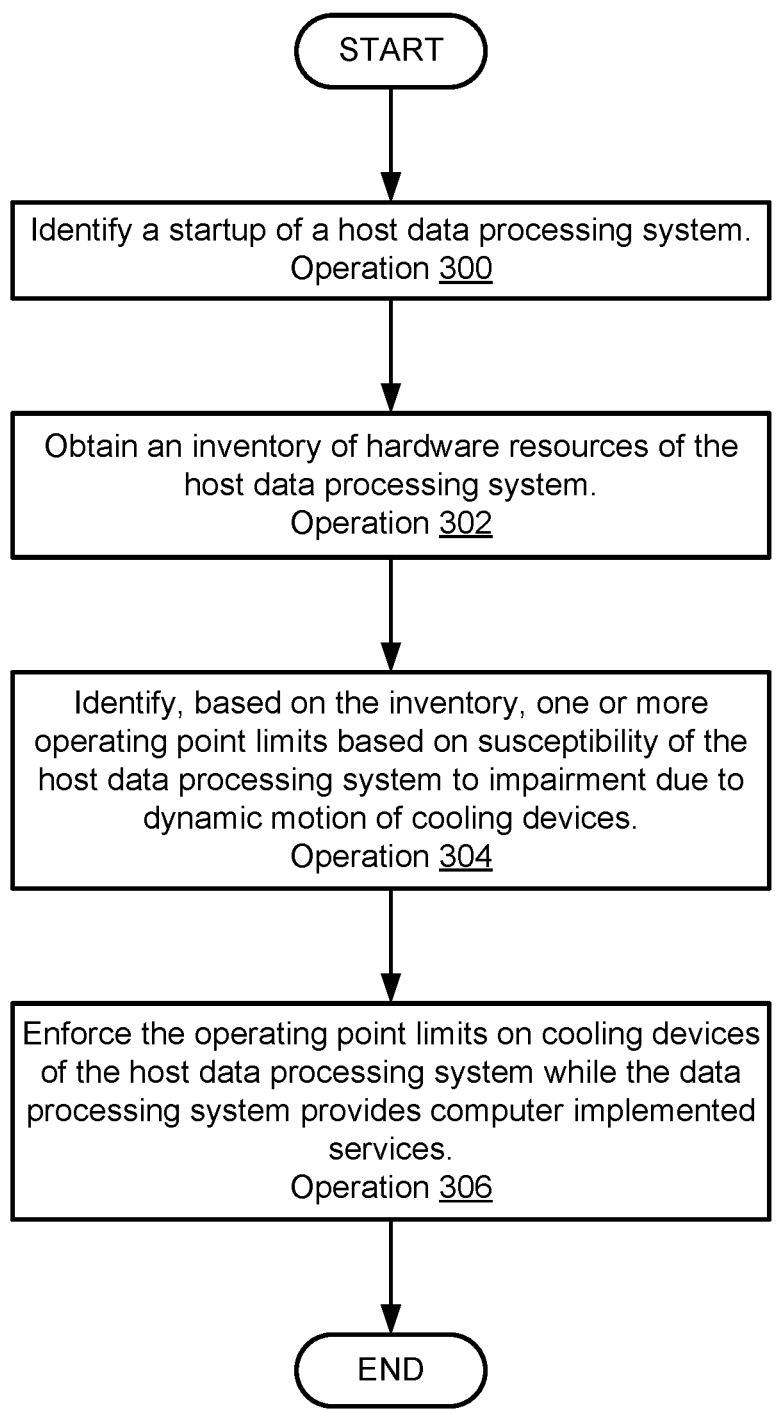
FIG. 3A shows a flow diagram illustrating a method of managing operating point limits in accordance with an embodiment.
Figure 3B:
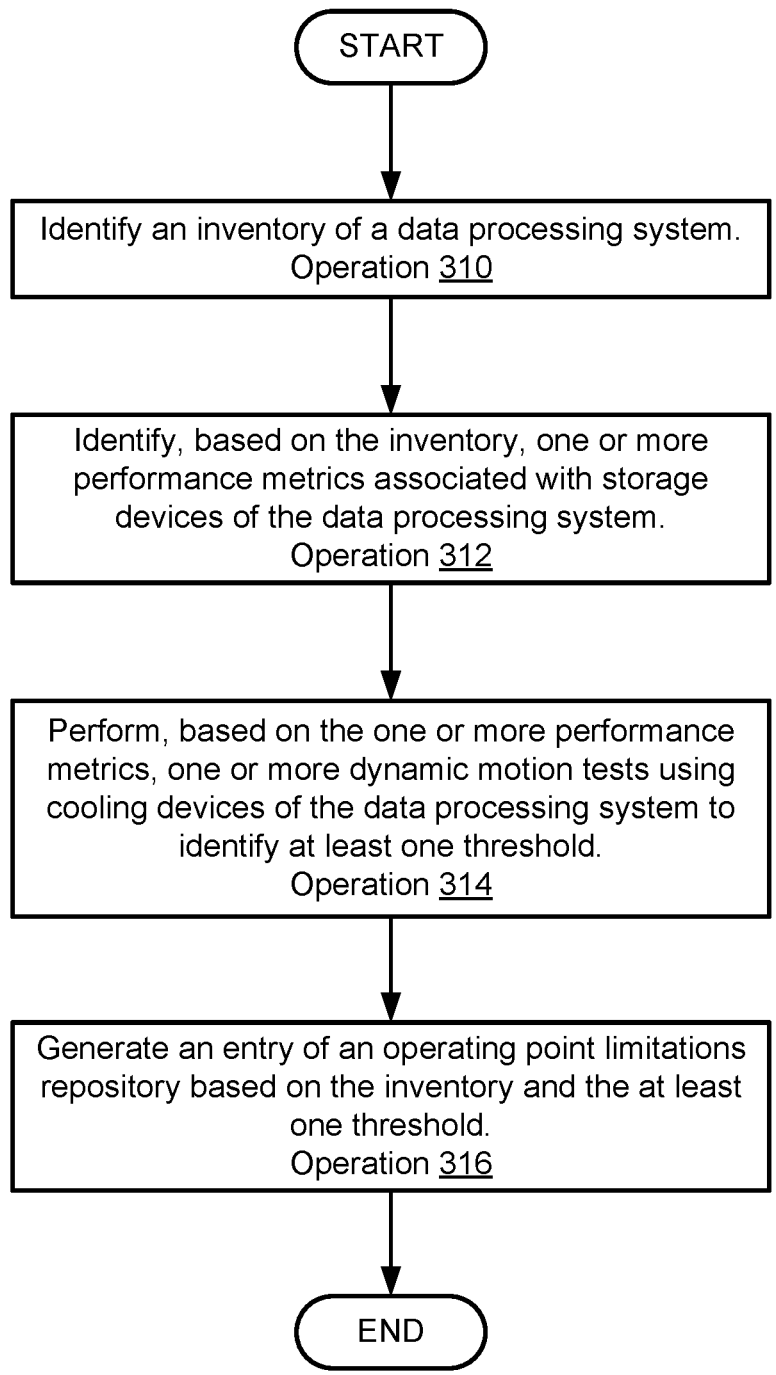
FIG. 3B shows a flow diagram illustrating a method of obtaining operating point limits in accordance with an embodiment.
Figure 4A:
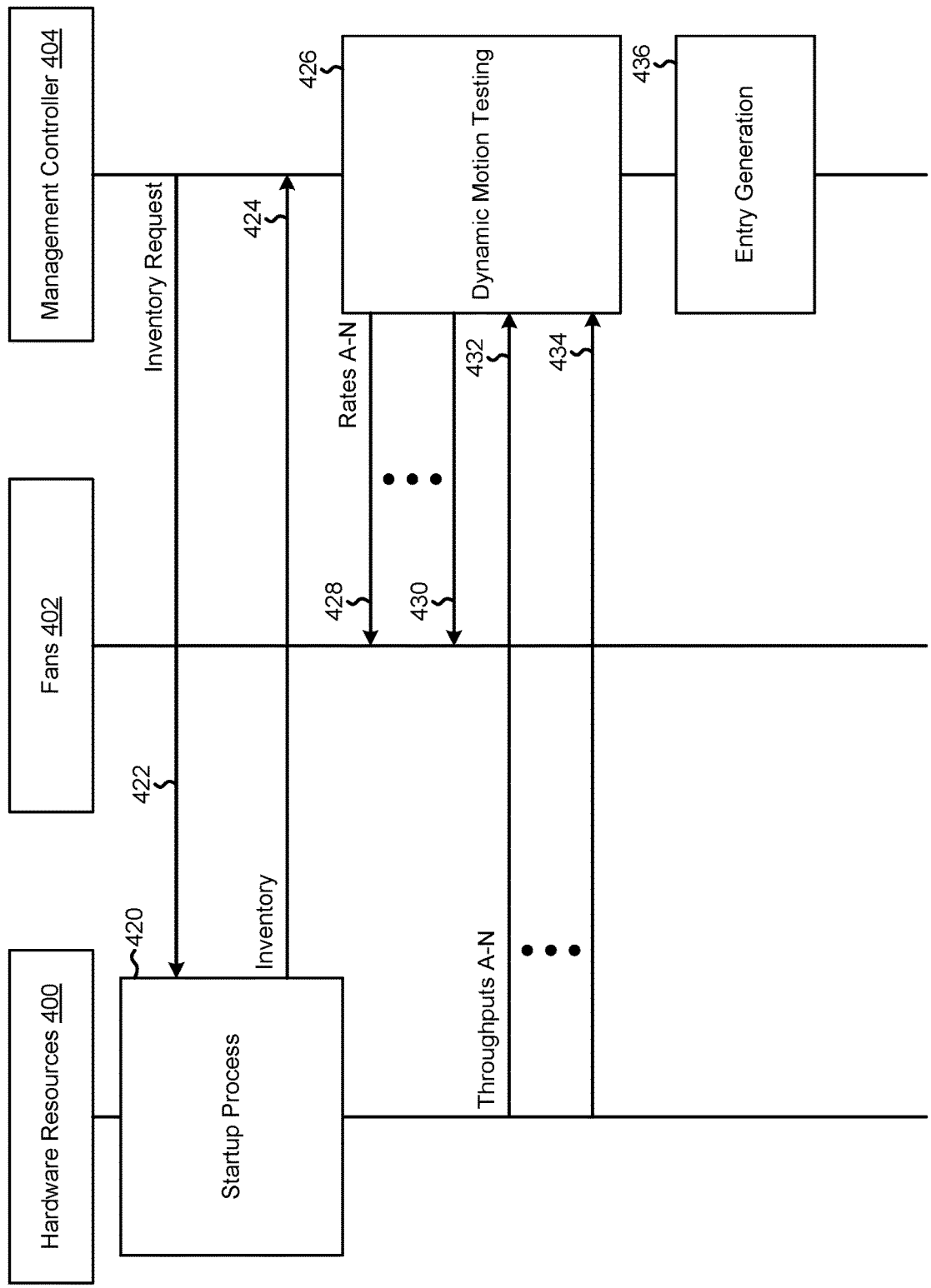
FIGS. 4A-4B shows interaction diagrams illustrating a process performed by an example system in accordance with an embodiment.
Figure 4B:
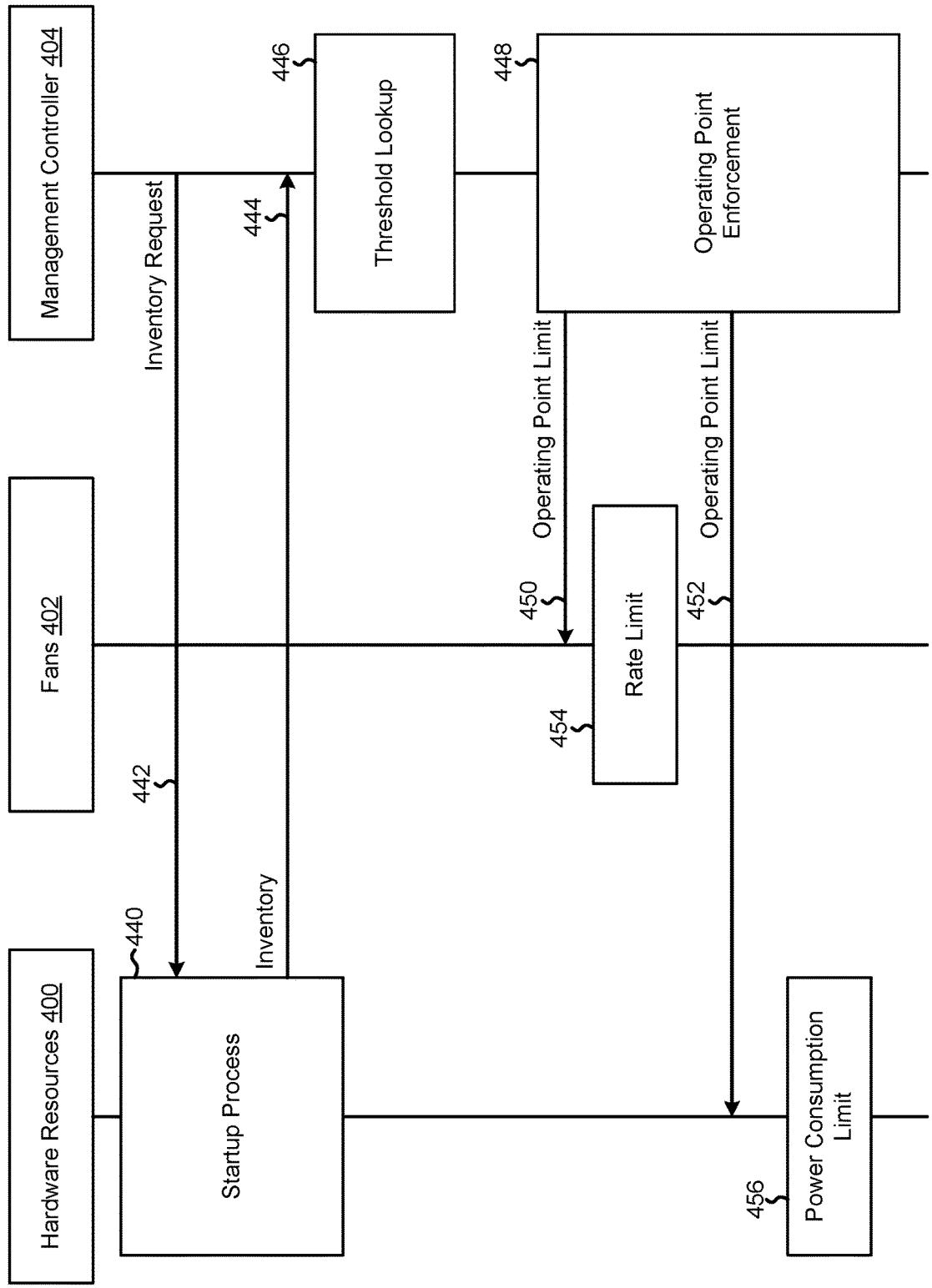

When providing its functionality, thermal manager 200 may perform all, or a portion, of the methods illustrated in FIGS. 3A-3B as well as any of the actions, operation, etc. shown in FIGS. 4A-4B.

In an embodiment, storage 210 is implemented using physical devices that provide data storage services (e.g., storing data and providing copies of previously stored data). The devices that provide data storage services may include hardware devices and/or logical devices. For example, storage 210 may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage 210 may include a memory device (e.g., a dual in line memory device) in which data is stored and from which copies of previously stored data are provided. In another example, storage 210 may include a persistent storage device (e.g., a solid-state disk drive) in which data is stored and from which copies of previously stored data is provided. In a still further example, storage 210 may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Storage 210 may also be implemented using logical storage. A logical storage (e.g., virtual disk) may be implemented using one or more physical storage devices whose storage resources (all, or a portion) are allocated for use using a software layer. Thus, a logical storage may include both physical storage devices and an entity executing on a processor or other hardware device that allocates the storage resources of the physical storage devices.

Storage 210 may store data structures including hardware resources inventory 212 and/or operating point limitations repository 214.

Hardware resources inventory 212 may be implemented using one or more data structures that include information regarding hardware resources 102. The information may include (i) a list of the hardware devices of hardware resources 102, (ii) types of the hardware devices in the list, (iii) topology information regarding the hardware devices in the list, and/or (iv) other types of information. In an embodiment, hardware resources inventory 212 is updated when data processing system 100 is reinitialized, restarted, etc. As part of the restart, a startup manager (e.g., a basic input output system or other startup application) of data processing system 100 may perform a hardware inventory of hardware resources 102. Thermal manager 200 may request a copy of the hardware inventory (e.g., via an interconnect between hardware resources 102 and management controller 106) to update hardware resources inventory 212.

Operating point limitations repository 214 may be implemented using one or more data structures that include information regarding limitations on the operating points of hardware resources 102 and/or fans 104. Operating point limitations repository 214 may be implemented using a look-up data structure which may utilize hardware resources inventory 212 as a key. When a lookup is performed, one or more operating point limits (e.g., thresholds) for hardware resources 102 and/or fans 104 may be obtained.

Figure 2B:
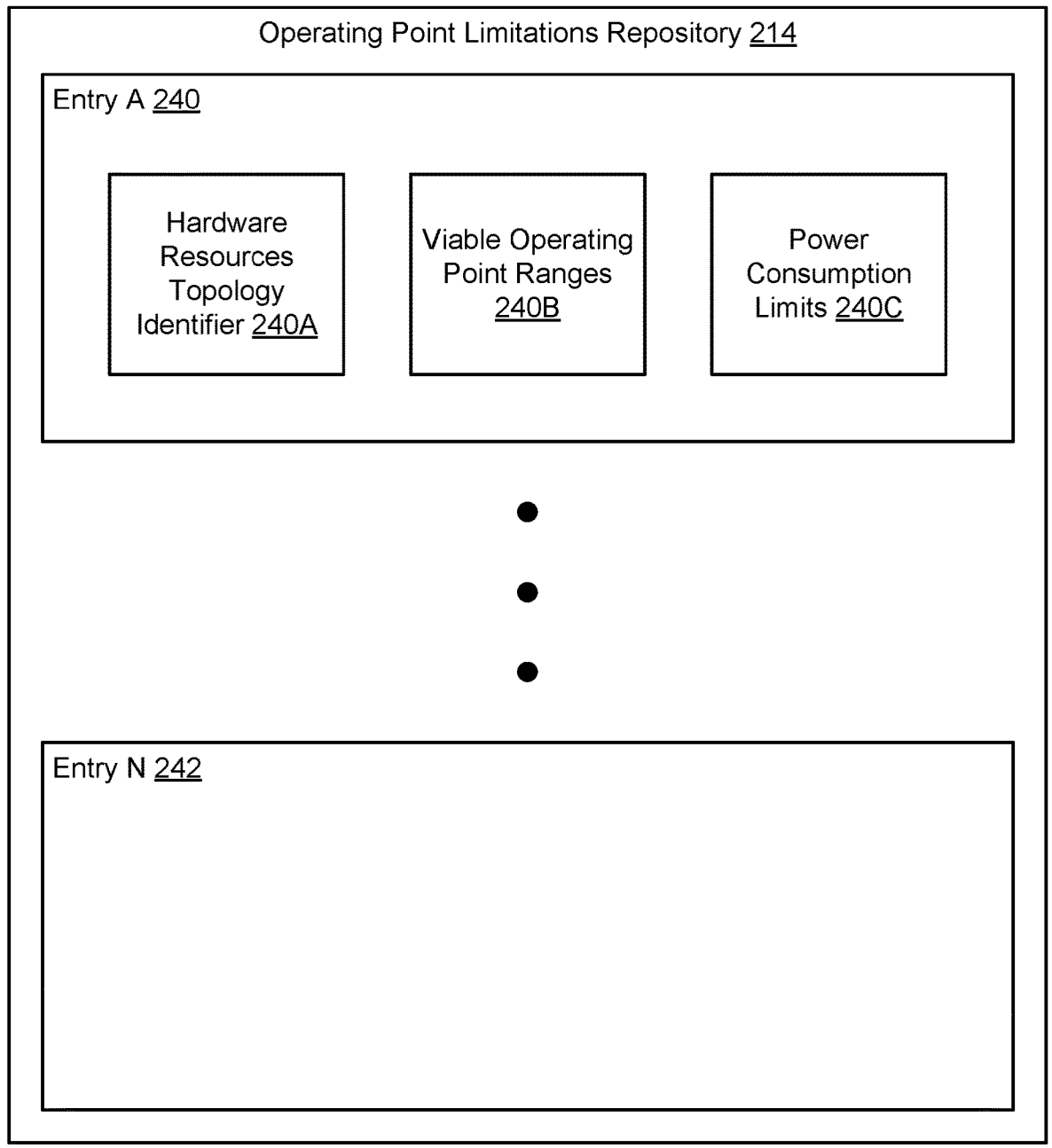
FIG. 2B shows a block diagram illustrating an operating point limitations repository in accordance with an embodiment.

Refer to FIG. 2B for additional details regarding operating point limitations repository 214.

While illustrated in FIG. 2A with a limited number of specific components, a data processing system may include additional, fewer, and/or different components without departing from embodiments disclosed herein.

Turning to FIG. 2B, a diagram of operating point limitations repository 214 in accordance with an embodiment is shown. Operating point limitations repository 214 may be implemented using, for example, a list of entries 240, 242.

Each entry may include a hardware resources topology identifier 240A, viable operating point ranges 240B, and/or power consumption limits 240C.

Hardware resources topology identifier 240A may indicate which hardware resources topologies are subject to the limitations included in the entry. For example, hardware resources topology identifier 240A may specify numbers, types, manufacturers, identifiers, and/or other characteristics of storage devices that invoke the limits identified by viable operating point ranges 240B and power consumption limits 240C. The hardware resources topology identifier of each entry may specify different numbers and types of storage devices. Thus, a hardware component inventory may be matched against the hardware resources topology identifier of the entries to identify an entry to be enforced on a data processing system.

In an embodiment, hardware resources topology identifier 240A may be implemented with a category identifier. A category identifier may be a classification for the storage devices of the hardware resources of a data processing system. Consequently, to perform appropriate entry matching, the storage devices of a data processing system may be subject to classification to identify a category. The identified category may then be matched to a corresponding entry to identify corresponding limitations to be enforced on the data processing system. The classification processes may be based, for example, on the hard disk drives or other types of spinning media (e.g., rather than all of the types of the storage devices of a data processing system). Such drives may be more susceptible to errors in operation due to dynamic motion. Consequently, using these types of drives as a basis for classifying a data processing system may reduce the complexity of classification while still ensuring that all of the data processing devices of a data processing system are not impaired due to dynamic motion.

In an embodiment, the hardware resources topology identifier 240A also takes into account the number and types of fans of a data processing system. For example, different data processing systems may include different numbers, types, and/or arrangements of fans. Thus, a multidimensional key based on the number and types of fans may be utilized for lookup purposes. Thus, both the hardware resources and fans may be used as a key when performing a lookup using the operating point limitations repository thereby returning different operating points for different numbers and types of fans.

Viable operating point ranges 240B may specify one or more operating point ranges for one or more fans. For example, the operating point ranges may be a subset of the entire range of a given fan. Thus, in some embodiments, the viable operating point ranges may indicate the viable operating point ranges by specifying one or more operating point thresholds that may not be exceeded. An example of an operating point threshold may be 80% (e.g., of the maximum operating point of a fan).

Power consumption limits 240C may specify one or more limitations on power consumption by one or more hardware resources. The power consumption limitations may be based on the viable operating point ranges 240B. For example, as discussed above, enforcing an operating point limitation on fans may reduce the rate at which various hardware resources may be cooled. Accordingly, to prevent the hardware resources from exceeding corresponding thermal operating ranges, the maximum power consumption by the hardware resources may be limited to less than a maximum power consumption rate for the hardware resources.

Like the viable operating point ranges 240B, the power consumption limits 240C may be specified on a granular level. For example, different power consumption limits for various types of hardware resources may be specified by power consumption limits 240C.

Operating point limitations repository 214 may include any number of entries without departing from embodiments disclosed herein.

While various data structures have been illustrated and described in FIGS. 2A-2B with specific structures, any of the data structures may be implemented with different structures (e.g., lists, tables, linked lists, databases, etc.), stored in different locations, and/or spanned across any number of devices without departing from embodiments disclosed herein.

As discussed above, the components of FIG. 1 may perform various methods to manage heat in a data processing system while limiting impairment of data storage systems. FIGS. 3A-3B illustrate examples of methods that may be performed by the components of FIG. 1. In the diagrams discussed below and shown in FIGS. 3A-3B, any of the operations may be repeated, performed in different orders, and/or performed in parallel with or a partially overlapping in time manner with other operations.

Turning to FIG. 3A, a flow diagram illustrating a method of operating a data processing device for thermal management purposes in accordance with an embodiment is shown. The method may be performed, for example, when a data processing system is initialized, restarted, etc. A management controller hosted by a host data processing system may perform the method.

At operation 300, a startup of the host data processing system is identified. The identification may be performed for example, by receiving a notification from a startup manager of the host data processing system, by power cycling of the management controller, or via other methods.

At operation 302, an inventory of hardware resources of the host data processing system is obtained. The inventory may be obtained by, for example, requesting it from a startup manager of the host managed system, reading from a storage or memory, or via other methods.

At operation 304, one or more operating point limitations based on susceptibility of the host data processing system to impairment due to dynamic motion of cooling devices is obtained. In an embodiment, the operating point limitations are obtained by performing a lookup in a lookup data structure. The inventory of hardware resources of the host data processing system may be used as a key.

In an embodiment, the inventory specifies types, quantities, and/or other characteristics of storage devices of the data processing system. The inventory may be matched to an entry of the lookup data structure. The entry may specify the limitations.

In an embodiment, the lookup data structure is stored in storage of the management controller.

In an embodiment, the one or more operating point limits specify one or more of (i) a limit on a rate of a fan of the host data processing system, and (ii) a limit on a power consumption rate of a hardware devices of the host data processing system. For example, the limit on the rate of the fan may specify that the fan may not exceed the limit on the rate of the fan. Likewise, the limit on the power consumption rate may specify a power consumption rate that may not be exceeded by the hardware devices (e.g., a processor, graphics processing unit, application specific integrated circuit, etc.).

At operation 306, the operating point limits are enforced on cooling devices of the host data processing system while the host data processing system provides computer implemented services. The operating point limits may be enforced by, for example, preventing a fan of the host data processing system from exceeding the fan rate and/or preventing the hardware device of the host data processing system from consuming power at a rate greater than the limit. For example, the hardware devices may be throttled to prevent the power consumption rate from being exceeded. Likewise, the amount of power with which the fan may be powered may be limited to limit the rate of the fan to not exceed the one or more operating point limits.

The method may end following operation 306.

The method illustrated in FIG. 3A may be repeated as components are added to, remove from, and/or replaced in the host data processing system. Consequently, different operating point limits may be enforced on the host data processing system over time. In this manner, the operating point limits may be dynamically adjusted thereby not overly limiting the host data processing system. Consequently, a host data processing system may be more likely to be able to obtain better performance from various hardware devices without impairing the operation of storage devices when compared with limiting the operation of fans of the host data processing system similarly under different operating conditions.

The specific operating point limits may be pre-stored in the management controller, may be dynamically updated over time (e.g., as new data becomes available), and/or through dynamic processes.

Turning to FIG. 3B, a flow diagram of a method of dynamically selecting operating point limits in accordance with an embodiment is shown. The method shown in FIG. 3B may be performed, for example, by a management controller, by another system, or by other entities.

At operation 310, an inventory of a data processing system is identified. The data processing system may host a management controller. The inventory may be of the hardware components of the data processing system. In an embodiment, the inventory only includes hardware components subject to impairment in performance due to dynamic motion. For example, only hard disk drives with spinning media or other types of dynamic motion sensitive data storage devices may be taken into account in the inventory.

The inventory may also take into account and/or reflect cooling devices of the data processing system, such as fans.

At operation 312, one or more performance metrics associated with storage devices of the data processing system are identified. The performance metrics may indicate the expected performance of the storage devices. The one or more performance metrics may be obtained by, for example, performing a lookup or search for the performance metrics based on identifies of the storage devices. For example, a manufacturer of the storage devices may specify the one or more performance metrics. Such performance metrics may be maintained in a local or remote repository that is in a searchable condition.

For example, the performance metrics may be maintained in a local or remote repository of a manufacturer/operator of the data processing system. Storage dynamic performance metrics may be collected and may be implemented for use with/by thermal manager 200.

At operation 314, one or more dynamic motions tests based on the one or more performance metrics are performed using cooling devices of the data processing system to identify at least one threshold. The one or more dynamic motion test may include (i) setting an operating point of one or more cooling devices and (ii) while at the operating point, measuring the data storage/access performance of the storage devices of the host managed system. The aforementioned process may be repeated any number of times for varying operating points of the one or more cooling devices. The at least one threshold may be identified as the highest operating point where the measured data storage/access performance meets the one or more performance metrics.

For example, the data read/write rate, IOPS rate, and/or other performance metrics may be measured while the fans are operated at different rates. Dependence of the performance metrics on the operating point of the fans may then be used to identify the at least one threshold. The at least one threshold may indicate that the performance of the storage devices is likely to be impaired if the fans are set at operating points exceeding the at least one threshold.

At operation 316, an entry of an operating point limitations repository is generated based on the inventory and the at least one threshold. For example, the inventory may serve as matching criteria for the entry and the at least one threshold may serve as a limitation of the entry. The entry may be similar to any of these illustrated in and discussed with respect to FIG. 2B.

The method may end following operation 316.

Using the methods illustrated in FIGS. 3A-3B, embodiments disclosed herein may provide for improved thermal management of a data processing system by reducing the likelihood of data storage devices being impacted by the thermal management operations. Consequently, the storage performance of the data processing system may be maintained.

Turning to FIGS. 4A-4B, operation diagrams in accordance with an embodiment are shown. In FIGS. 4A-B, operations performed by the respective components are shown along the lines extending from the corresponding boxes labeled with the component names. Operations impacting multiple components, such as data transmissions between the components, are shown using arrows extending between these lines. Generally, the operations are ordered temporally with respect to one another (e.g., with earlier performed operations being located towards a top of the page and later operations being located towards a bottom of the page). However, it will be appreciated that the operations may be performed in other orders from those illustrated herein.

Now, consider an example scenario in which a data processing system includes hardware resources 400, fans 402, and management controller 404.

At block 420, a startup process may be performed when the data processing system is powered on. The startup processing may include, for example, performing a power on self-test process, inventorying hardware components, and preparing to handoff operational management of the data processing device to a management entity such as an operating system.

Management controller 404, at block 422, may identify the startup process and send an inventory request for the inventory obtained by the startup process. At block 424, the inventory is provided to management controller 404 in response to the request.

To ascertain limit on the operating point of fans 402 and/or hardware resources 400, at block 426, management controller 404 may perform dynamic motion testing. The testing may include, at blocks 428-430, initiating operation of fans 402 at different rates A-N by sending corresponding instruction to fans 402, or controllers thereof.

While fans 402 are operating at the respective rates, at blocks 432-434, data throughputs A-N from hardware resources 400 may be obtained by management controller 404. The data throughputs A-N may be associated with data storage devices of hardware resources 400 subject to impairment due to dynamic loads imposed on them by operation of fans 402.

At block 436, using the rates, throughputs, and inventory, management controller 404 performs entry generation for the data processing system. The entry may specify the ranges of operating rates at which fans 402 were able to operate without impairing the data throughputs obtained from hardware resources 400.

Thus, via blocks 420-436, a management controller 404 may identify appropriate fan rate limits for a particular arrangement of hardware resources 400. The aforementioned blocks may be repeated any number of times thereby allowing for corresponding fan rate limits for any number of hardware resource arrangements to be obtained.

Turning to FIG. 4B, now consider that, after generation of the entry, the data processing system is restarted. At block 440, hardware resources 400 may perform a similar startup process to that discussed with respect to FIG. 4A. Likewise, in blocks 442-444, management controller 404 may request and obtain an inventory for hardware resources 400.

At block 446, management controller 404 performs a threshold lookup (e.g., a limitation lookup) for the data processing system to identify a fan rate limit and/or a power consumption limit. The lookup may be performed by matching the inventory to entry as discussed with respect to FIG. 4A.

At block 448, management controller 404 performs operating point enforcement on fans 402 and hardware resources 400. To do so, at block 450, management controller 404 enforces an operating point limit on fans 402 that limits the maximum rate at which fan 402 may operate.

Based on the operating point limit, at block 454, fans 402 perform a rate limit that ensures that fans 402 do not exceed the operating point limit. Consequently, the maximum cooling provided by fans 402 may be reduced.

To offset the reduction in cooling, at block 452, management controller 404 may enforce another operating point limit on hardware resources 400. The operating point limit enforced on hardware resources 400 may depend on the operating point limit enforced on fans 402. For example, lowering operating point limits enforced on fans 402 may require lower operating point limits to be enforced on hardware resources 400.

Consequently, at block 456, hardware resources 400 perform enforce a power consumption limit on one or more hardware devices (e.g., processors, graphics processing units, etc.) to ensure that the operating point limit enforced on fans 402 does not cause hardware resources 400 to exceed its thermal limits.

The process may end following block 456.

Following block 456, the processes may be repeated as the hardware devices of hardware resources 400 change over time.

Any of the components illustrated in FIGS. 1-4B may be implemented with one or more computing devices. Turning to FIG. 5, a block diagram illustrating an example of a data processing system (e.g., a computing device) in accordance with an embodiment is shown. For example, system 500 may represent any of data processing systems described above performing any of the processes or methods described above. System 500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 500 is intended to show a high level view of many components of the computer system. However, it is to be understood that additional components may be present in certain implementations and furthermore, different arrangement of the components shown may occur in other implementations. System 500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 500 includes processor 501, memory 503, and devices 505-508 via a bus or an interconnect 510. Processor 501 may represent a single processor or multiple processors with a single processor core or multiple processor cores included therein. Processor 501 may represent one or more general-purpose processors such as a microprocessor, a central processing unit (CPU), or the like. More particularly, processor 501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 501, which may be a low power multi-core processor socket such as an ultra-low voltage processor, may act as a main processing unit and central hub for communication with the various components of the system. Such processor can be implemented as a system on chip (SoC). Processor 501 is configured to execute instructions for performing the operations discussed herein. System 500 may further include a graphics interface that communicates with optional graphics subsystem 504, which may include a display controller, a graphics processor, and/or a display device.

Processor 501 may communicate with memory 503, which in one embodiment can be implemented via multiple memory devices to provide for a given amount of system memory. Memory 503 may include one or more volatile storage (or memory) devices such as random access memory (RAM), dynamic RAM (DRAM), synchronous DRAM (SDRAM), static RAM (SRAM), or other types of storage devices. Memory 503 may store information including sequences of instructions that are executed by processor 501, or any other device. For example, executable code and/or data of a variety of operating systems, device drivers, firmware (e.g., input output basic system or BIOS), and/or applications can be loaded in memory 503 and executed by processor 501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 500 may further include IO devices such as devices (e.g., 505, 506, 507, 508) including network interface device(s) 505, optional input device(s) 506, and other optional IO device(s) 507. Network interface device(s) 505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 506 may include a mouse, a touch pad, a touch sensitive screen (which may be integrated with a display device of optional graphics subsystem 504), a pointer device such as a stylus, and/or a keyboard (e.g., physical keyboard or a virtual keyboard displayed as part of a touch sensitive screen). For example, input device(s) 506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 507 may include an audio device. An audio device may include a speaker and/or a microphone to facilitate voice-enabled functions, such as voice recognition, voice replication, digital recording, and/or telephony functions. Other IO devices 507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 510 via a sensor hub (not shown), while other devices such as a keyboard or thermal sensor may be controlled by an embedded controller (not shown), dependent upon the specific configuration or design of system 500.

To provide for persistent storage of information such as data, applications, one or more operating systems and so forth, a mass storage (not shown) may also couple to processor 501. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 501, e.g., via a serial peripheral interface (SPI). This flash device may provide for non-volatile storage of system software, including a basic input/output software (BIOS) as well as other firmware of the system.

Storage device 508 may include computer-readable storage medium 509 (also known as a machine-readable storage medium or a computer-readable medium) on which is stored one or more sets of instructions or software (e.g., processing module, unit, and/or processing module/unit/logic 528) embodying any one or more of the methodologies or functions described herein. Processing module/unit/logic 528 may represent any of the components described above. Processing module/unit/logic 528 may also reside, completely or at least partially, within memory 503 and/or within processor 501 during execution thereof by system 500, memory 503 and processor 501 also constituting machine-accessible storage media. Processing module/unit/logic 528 may further be transmitted or received over a network via network interface device(s) 505.

Computer-readable storage medium 509 may also be used to store some software functionalities described above persistently. While computer-readable storage medium 509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Processing module/unit/logic 528, components and other features described herein can be implemented as discrete hardware components or integrated in the functionality of hardware components such as ASICS, FPGAs, DSPs or similar devices. In addition, processing module/unit/logic 528 can be implemented as firmware or functional circuitry within hardware devices. Further, processing module/unit/logic 528 can be implemented in any combination hardware devices and software components.

Note that while system 500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments of the invention as described herein.

In the foregoing specification, embodiments have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data processing system to provide computer implemented services, the data processing system comprising:
    hardware resources used to provide the computer implemented services;

a fan adapted to generate a gas flow proximate to the hardware resources for thermal management; and a management controller adapted to:
obtain an inventory of the hardware resources at startup of the data processing system;
identify, based on the inventory, one or more operating point limits based on susceptibility of a storage device of the hardware resources to impairment due to a dynamic mechanical load due to operation of the fan; and
enforce the one or more operating point limits on the data processing system while the computer implemented services are being provided to prevent the impairment of the storage device.

2. The data processing system of claim 1, wherein enforcing the one or more operating point limits on the data processing system comprises:
preventing the fan from exceeding a rate of rotation based on the one or more operating point limits, the rate of rotation being less than a maximum rate of rotation of the fan.

3. The data processing system of claim 2, wherein enforcing the one or more operating point limits on the data processing system further comprises:
preventing a processor of the hardware resources from exceeding a rate of power consumption based on the one or more operating point limits, the rate of power consumption being based on the rate of rotation; and rate of power consumption being less than a second power consumption rate associated with a maximum performance level of the processor.

4. The data processing system of claim 3, wherein a maximum data access rate of the storage device is reduced by a rotation rate of the fan exceeding the rate of rotation.

5. The data processing system of claim 1, wherein the management controller is further adapted to:
identify, based on a second inventory of the hardware resources, that the storage device has been replaced with a second storage device;
identify, based on the second inventory, one or more second operating point limits based on susceptibility of the second storage device to impairment due to the dynamic mechanical load due to the operation of the fan; and
enforce the one or more second operating point limits on the data processing system while the computer implemented services are being provided to prevent the impairment of the second storage device, the one or more operating point limits not being enforced while the one or more second operating point limits are enforced.

6. The data processing system of claim 1, wherein the susceptibility of the storage device of the hardware resources to impairment due to the dynamic mechanical load due to operation of the fan is determined by:
identifying one or more performance metrics associated with the storage device;
performing one or more dynamic motion tests using the fan and the one or more performance metrics to identify at least one threshold; and
using the threshold to define the susceptibility of the storage device to the impairment.

7. The data processing system of claim 6, wherein the one or more dynamic motion tests are performed by:
setting operation of the fan to test operating points;
while in each of the test operating points, recording data access performance of the storage device; and comparing the data access performance to the one or more performance metrics to identify the threshold.

8. The data processing system of claim 1, wherein identifying the one or more operating point limits comprises:
obtaining an identifier of the fan; and
performing a lookup using the identifier of the fan with a data structure stored in the management controller, the lookup providing the one or more operating point limits.

9. The data processing system of claim 8, wherein the management controller comprises a computing device hosted by the data processing system, the computing device operating independently from the data processing system.

10. The data processing system of claim 1, wherein the impairment of the storage device comprises a reduction in a rate of data access by the storage device below a nominal rate of data access by the storage device and/or a reduction in operating life of the storage device.

11. The data processing system of claim 1, wherein identifying the one or more operating point limits comprises:
classifying the storage device into a category;
performing a lookup using the category with a data structure stored in the management controller, the lookup providing the one or more operating point limits.

12. The data processing system of claim 11, wherein the category is one of a plurality of categories that are updated over time as new storage devices become available for deployment to the data processing system.

13. A method of thermally managing a data processing system providing computer implemented services, the method comprising:
obtaining, by a management controller hosted by the data processing system, an inventory of hardware resources of the data processing system at startup of the data processing system;
identifying, by the management controller and based on the inventory, one or more operating point limits based on susceptibility of a storage device of the hardware resources to impairment due to a dynamic mechanical load due to operation of a fan used to thermally manage the hardware resources; and
enforcing the one or more operating point limits on the data processing system while the computer implemented services are being provided to prevent the impairment of the storage device.

14. The method of claim 13, wherein enforcing the one or more operating point limits on the data processing system comprises:
preventing the fan from exceeding a rate of rotation based on the one or more operating point limits, the rate of rotation being less than a maximum rate of rotation of the fan.

15. The method of claim 14, wherein enforcing the one or more operating point limits on the data processing system further comprises:
preventing a processor of the hardware resources from exceeding a rate of power consumption based on the one or more operating point limits, the rate of power consumption being based on the rate of rotation; and rate of power consumption being less than a second power consumption rate associated with a maximum performance level of the processor.

16. The method of claim 15, wherein a maximum data access rate of the storage device is reduced by a rotation rate of the fan exceeding the rate of rotation.

17. A non-transitory computer readable medium storing instructions that, when executed by a processor, cause a method for thermally managing a data processing system providing computer implemented services, the method comprising:
- obtaining, by a management controller hosted by the data processing system, an inventory of hardware resources of the data processing system at startup of the data processing system;
- identifying, by the management controller and based on the inventory, one or more operating point limits based on susceptibility of a storage device of the hardware resources to impairment due to a dynamic mechanical load due to operation of a fan used to thermally manage the hardware resources; and
- enforcing the one or more operating point limits on the data processing system while the computer implemented services are being provided to prevent the impairment of the storage device.

18. The non-transitory computer readable medium of claim 17, wherein enforcing the one or more operating point limits on the data processing system comprises:
- preventing the fan from exceeding a rate of rotation based on the one or more operating point limits, the rate of rotation being less than a maximum rate of rotation of the fan.

19. The non-transitory computer readable medium of claim 18, wherein enforcing the one or more operating point limits on the data processing system further comprises:
- preventing a processor of the hardware resources from exceeding a rate of power consumption based on the one or more operating point limits, the rate of power consumption being based on the rate of rotation; and
- rate of power consumption being less than a second power consumption rate associated with a maximum performance level of the processor.

20. The non-transitory computer readable medium of claim 19, wherein a maximum data access rate of the storage device is reduced by a rotation rate of the fan exceeding the rate of rotation.

* * * * *